United States Patent
Greci et al.

(10) Patent No.: US 6,366,033 B1
(45) Date of Patent: Apr. 2, 2002

(54) MOLECULAR LANTHANIDE COMPLEXES FOR PHOSPHOR APPLICATIONS

(75) Inventors: Michael A. Greci, Mentor, OH (US); Alok Srivastava, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/691,693

(22) Filed: Oct. 18, 2000

(51) Int. Cl.$^7$ ............................................. H01L 33/00
(52) U.S. Cl. ..................... 315/363; 313/502; 313/504; 257/89
(58) Field of Search ..................... 313/502–506, 313/512; 257/89, 98–103; 556/19–22; 315/363, 375

(56) References Cited

U.S. PATENT DOCUMENTS 5,698,022 A * 12/1997 Glassman et al. ............ 556/19
6,084,250 A * 7/2000 Justel et al. ................ 313/502

OTHER PUBLICATIONS

Matthew R. Robinson, et al. "Synthesis, morphology and optoelectronic properties of tris [ (N–ethylcarbazolyl) ( 3', 5'–hexyloxybenzol) methane] (phenathroline)–europium", *Chem. Commun.*, 2000, 1645–1646.
"Modular molecule design leads to new LEDs", *C&FN*, Aug. 24, 2000, 22.

* cited by examiner

Primary Examiner—Don Wong
Assistant Examiner—Wilson Lee
(74) Attorney, Agent, or Firm—Fay, Sharpe, Fagan, Minnich & McKee, LLP

(57) ABSTRACT

A light source is provided which contains a light emitting component and at least one phosphor material. The phosphor material absorbs radiation emitted by the light emitting component and converts that radiation to visible light of a desired color. The phosphor composition is a molecular compound of the formula $LnA_XB_Y$, wherein Ln is a lanthanide, A is β-diketonate ligands, B is at least one additional ligand, and X and Y are integers.

22 Claims, 1 Drawing Sheet

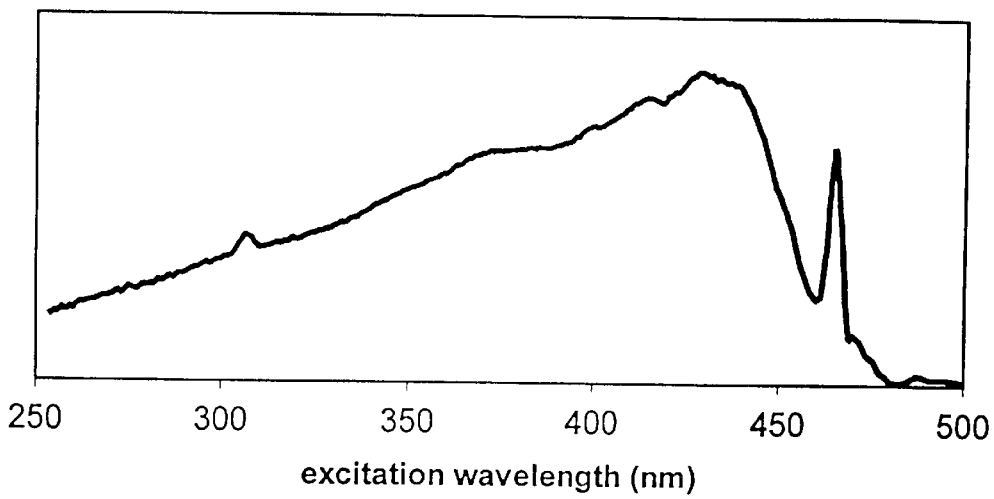
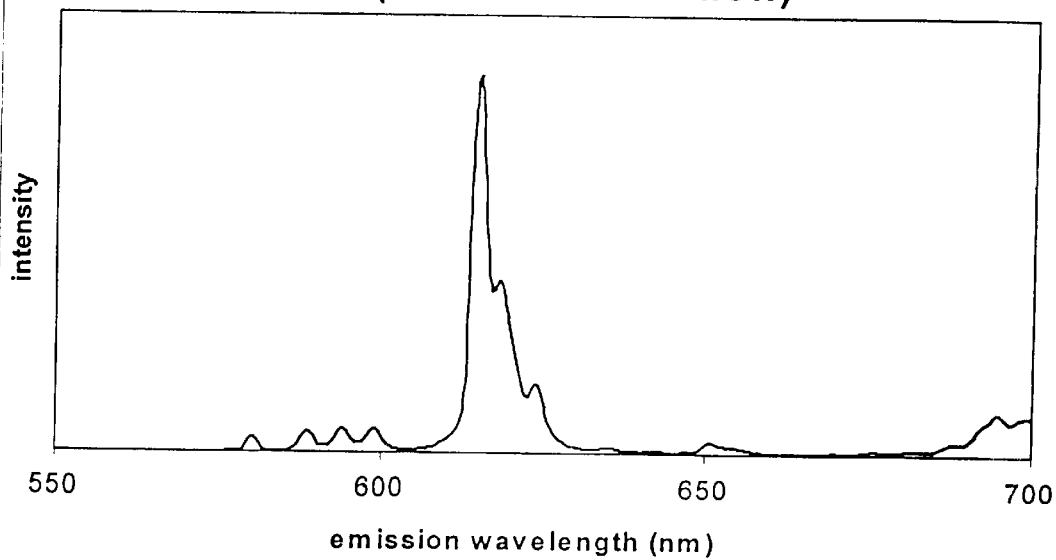

MOLECULAR LANTHANIDE COMPLEXES FOR PHOSPHOR APPLICATIONS

BACKGROUND OF THE INVENTION

1. Field of the Invention

This invention relates to light emitting devices including a radiation source, and an excitable phosphor. It more specifically relates to the application of a class of chemical compounds for use as phosphors for the conversion of radiation into visible light in light emitting devices.

2. Discussion of the Art

Lanthanide-based phosphors have applications in multi-component phosphor lighting applications. Current lanthanide-based inorganic phosphors such as $Y_2O_3$:Eu and $LaPO_4$:Ce, Tb, typically absorb 254 nm radiation effectively. For this reason, the lanthanide-based inorganic phosphors are useful in mercury discharge applications, such as fluorescent lighting. However, new high-efficiency light sources, such as light emitting diodes (LEDs), require phosphors that readily absorb near ultraviolet radiation in the 300–460 nm range where conventional lanthanide-based inorganic phosphors typically do not strongly absorb.

LEDs and laser diodes (LD) have been produced from Group III-V alloys such as gallium nitride (GaN). To form the LEDs, for example, layers of the alloys are typically deposited epitaxially on a substrate, such as silicon carbide or sapphire, and may be doped with a variety of n and p-type dopants to improve properties such as light efficacy. With reference to the GaN-based LEDs, light is generally emitted in the UV and/or blue range of the electromagnetic spectrum.

Recently, techniques have been developed for converting radiation emitted from LEDs to useful light for illumination purposes. By using a phosphor excited by the radiation generated by the LED, light of different wavelengths may be generated to produce desired color points. For example, a combination of LED generated radiation and phosphor converted light may produce visible light (e.g. white). There are few known lanthanide-based phosphors which readily absorb in the UV wavelength region and have efficient luminescence in the visible spectral region. This is especially true for narrow-band red phosphors.

The known lanthanide phosphors which are applicable for lighting applications are solid state compounds, such as $Y_2O_3$:Eu, which readily absorb radiation below 300 nm, in the far UV range. Solid state compounds have specific ligands which can not be easily varied on the molecular level. In contrast, the use of a molecular compound permits the facile manipulation of the ligands on the molecular level, which allows the compound to fulfill the design criteria for a given application.

A class of lanthanide-based molecular compounds which will act as phosphors capable of readily absorbing electromagnetic radiation and converting that radiation to visible light is therefore desirable.

BRIEF SUMMARY OF THE INVENTION

In an exemplary embodiment of the present invention, a light emitting device is provided. The light emitting device includes a light emitting component and at least one phosphor material. The phosphor material absorbs electromagnetic radiation emitted by the light emitting component and converts that radiation to visible light of the desired color. The use of a lanthanide based molecular compound as a phosphor composition in lighting applications is described.

The phosphor composition contains a lanthanide, Ln; β-diketonate ligands, A; and at least one additional ligand, B. The components of the phosphor composition are combined in accordance with the formula $LnA_XB_Y$, where X and Y are integers ranging from about 1 to about 10.

A light emitting device containing a light source and a phosphor is provided. The phosphor is a molecular compound of the formula $LnA_XB_Y$, where Ln is a lanthanide, A is β-diketonate ligands, B is an additional ligand, and X and Y are integers ranging from about 1 to about 10.

A primary benefit of the invention resides in the ability to vary the components of the phosphor composition on the molecular level to fulfill the design criteria for a given application.

Another primary benefit of the invention resides in the efficient luminescence in the visible spectral region.

Still further advantages and benefits of the present invention will become apparent to those of ordinary skill in the art upon reading and understanding the following detailed description of the various embodiments.

BRIEF DESCRIPTION OF THE DRAWINGS

FIG. 1 is an excitation spectrum of a molecular phosphor representative of the present invention.

FIG. 2 is an emission spectrum of a molecular phosphor representative of the present invention.

DETAILED DESCRIPTION OF THE INVENTION

The present invention focuses on the use of a molecular lanthanide containing compound as a phosphor in any configuration of a light emitting device containing a light source, including, but not limited to, discharge lamps, fluorescent lamps, LEDs, and LDs. While the use of the present phosphor is contemplated for a wide array of lighting, the present invention is described with particular reference to and finds particular application to LEDs. As used herein, the term "light" encompasses radiation in the UV, IR and visible regions of the electromagnetic spectrum.

Any configuration of a light source which includes a LED and a phosphor composition is contemplated in the present invention. In an exemplary embodiment, the phosphor is located adjacent to the LED. In another embodiment, the phosphor is situated between encapsulant layers and is not in direct contact with the LED. In yet another embodiment, the phosphor is dispersed throughout an encapsulating layer. Notwithstanding these described configurations, the skilled artisan will recognize that any LED configuration may be improved by the inclusion of the present inventive phosphor.

The phosphor composition is a molecular compound comprising a lanthanide, Ln; β-diketonate ligands, A, and at least one additional ligand, B. The phosphor conforms to the general formula $LnA_XB_Y$, wherein X and Y are integers between about 1 and 10.

The choice of the lanthanide component of the molecular phosphor composition determines the emission wavelength of the phosphor. For example, when the exciting radiation is in the UV range and Ln=europium, the peak in the emission spectrum is typically of longer wavelength (580–660 nm), and appears red. When the exciting radiation is in the UV range and Ln=terbium, the peak in the emission spectrum is typically of shorter wavelength, and appears green. When the exciting radiation is in the UV range and Ln=thulium or cerium, the peak in the emission spectrum may be of even shorter wavelength, and appear blue. It is therefore apparent that by choosing the correct lanthanide component in the present inventive phosphor, UV radiation from a LED can be converted to different visible colors.

The lanthanide component of the present invention is chosen from the group consisting of lanthanum, yttrium, cerium, praseodymium, neodymium, samarium, europium, gadolinium, terbium, dysoprosium, holmium, erbium, thulium, ytterbium, lutetium, and mixtures thereof. The preferred lanthanide, or mixtures thereof, is chosen to correspond to the emission wavelengths desired in the light emitting device.

The physical properties of the phosphor, such as the melting point, boiling point, and the location and shape of the absorption spectrum can be manipulated by the choice of the β-diketonate ligands, A, and the B ligands. The β-diketonate ligands are chosen from the group including, but not limited to, ligands of the general formula $RCOCH_2COR'$. R and R' are independently chosen, and can be any functional group which sufficiently stabilizes the ligand and complexes of the ligand with the lanthanide and some combinations of B ligands. Exemplary functional groups for use in the β-diketonate ligands are alkyl and substituted alkyl groups with between about 1 and about 20 carbons in the alkyl chain, preferably between about 1 and about 15 carbons in the alkyl chain, and most preferably between about 1 and about 10 carbons in the alkyl chain. Exemplary alkyl groups include substituted and unsubstituted, linear and branched methyl, ethyl, propyl, butyl, penta, hexa, hepta, octa, nona, deca, and mixtures thereof. Preferred functional groups are selected from the group consisting of, but not limited to, $CH_3$, $CH_2F$, $CHF_2$, $CF_3$, $CH_2CH_3$, $CH(CH_3)_2$, $C(CH_3)_3$, $C(C_6H_5)_3$, $CH_2NH_2$, $CH(NH_2)_2$, $C(NH_2)_3$, $CH_2[N(CH_3)_2]$, $CH[N(CH_3)_2]_2$, $C[N(CH_3)_2]_3$, $CH_2\{N[CH_2(CH_3)]_2\}$, $CH\{N[CH_2(CH_3)]_2\}_2$, $C\{N[CH_2(CH_3)]_2\}_3$, $N[CH_2(CH_3)]_2$, $N(CH_3)_2$, $Si(CH_3)_3$, and mixtures thereof.

The physical properties of the present phosphor composition may also be varied by the choice of the B ligand. The B ligand is preferably one or more ligand of the general formula $R''(ZCH_2CH_2)_nZ'R'''$, wherein R'' and R''' are independently alkyl or substituted alkyl groups and n is an integer between about 1 and about 10. Z and Z' are independently chosen from the group including oxygen, sulfur, tertiary phosphines, secondary phosphines, tertiary amines, secondary amines, and mixtures thereof. The secondary phosphines, tertiary phosphines, secondary amines, and tertiary amines are further functionalized from the group including hydrogen, hydroxyl, alkyl, alkoxy, amine, ethers, esters, and mixtures thereof capable of forming stable complexes with some combination of lanthanide and β-diketonate ligands.

In addition, the B ligands may alternatively be one or more inorganic ligands capable of forming stable complexes with some combination of lanthanide and β-diketonate ligands. Inorganic ligands of this type include tetrahydrofuran, dioxane, pyridine, 2,2'-bipyridine, phenanthroline, and mixtures thereof.

In the general formula $LnA_XB_Y$, X and Y are integers in the range of about 1 to about 12. X and Y are dependently chosen such that X+Y is not greater than the coordination number of the chosen lanthanide. For example, if the lanthanide chosen is europium, X+Y must be less than or equal to 12. It would be possible for X+Y to be equal to a number less than the coordination number of the chosen lanthanide if, for example, B is chosen to be a multidentate ligand, or if R or R' are chosen to be a substituted alkyl groups which are capable of occupying more than one coordination site on the lanthanide.

Preferred examples of this class of phosphors are
$Ln(CF_3COCH_2COCF_3)_3[CH_3(OCH_2CH_2)_3OCH_3]$,
$Ln(CF_3COCH_2COCF_3)_3[CH_3(OCH_2CH_2)_2OCH_3]$,
$Ln(CF_3COCH_2COCF_3)_3(CH_3OCH_2CH_2OCH_3)$,
$Ln(CF_3COCH_2COCH_3)_3[CH_3(OCH_2CH_2)_3OCH_3]$,
$Ln(CF_3COCH_2COCH_3)_3[CH_3(OCH_2CH_2)_2OCH_3]$,
$Ln(CF_3COCH_2COCH_3)_3(CH_3OCH_2CH_2OCH_3)$,
$Ln(CF_3COCH_2COCF_3)_3(2,2'\text{-bipyridine})_m$, and
$Ln(CF_3COCH_2COCH_3)_3(2,2'\text{-bipyridine})_m$. In these exemplary examples, Ln is any lanthanide, and m is an integer between about 1 and about 12. Many other examples of suitable phosphors which adhere to the general formula $LnA_XB_Y$ are contemplated and will be obvious to the skilled artisan. The above list is intended to be illustrative and should not be construed to be limiting in any way.

The phosphor material of the present invention may additionally include more than one phosphor, such as two or more different phosphors. Accordingly, the phosphors may be mixed or blended to produce desired colors. It is generally known that phosphor powders do not interact as a result of lamp making and they exhibit the beneficial property that their spectra are cumulative in nature. Hence, the spectrum of an LED that includes a blend of phosphors will be a linear combination of the spectra of LEDs coated with the individual phosphors. For example, if a red phosphor of the present invention, $Eu(CF_3COCH_2COCF_3)_3[CH_3(OCH_2CH_2)_2OCH_3]$ were mixed with any blue phosphor, the light produced would appear purple to the eye.

In an exemplary embodiment, the physical characteristics of the red phosphor $Eu(CF_3COCH_2COCF_3)_3[CH_3(OCH_2CH_2)_2OCH_3]$ are described by FIGS. 1 and 2. FIG. 1 is the excitation spectrum of the noted red phosphor and is a measurement of the relative intensity of the red emission versus excitation wavelength, while the red emission is measured at a constant wavelength. FIG. 2 is the emission spectra of the noted red phosphor and is a measurement of the relative intensity of emitted light at various wavelengths while the excitation is held constant. In FIG. 1, it can be seen that when the emission intensity of the phosphor at 615 nm is measured, it is most intense when excited by radiation in the range of about 300–450 nm, which is in the near-UV range of the electromagnetic spectrum. FIG. 2 shows that when the excitation of the phosphor is held constant at 450 nm (the sample is excited only by radiation at 450 nm), the emission wavelength of the phosphor is strongest in the range of about 605–630 nm, which is perceived as red by the eye.

Light sources suited to use in the present invention include but are not limited to GaN-based (InAlGaN) semiconductor devices. Suitable GaN semiconductor materials for forming the light emitting components are generally represented by the general formula $In_IGa_JAl_KN$, where I, J, and K are greater than or equal to zero, and I+J+K=1. The nitride semiconductor materials may thus include materials such as InGaN and GaN, and may be doped with various impurities, for example, for improving the intensity or adjusting the color of the emitted light. LDs are similarly formed from an arrangement of GaN layers. Techniques for forming LEDs are well known in the art so that further discussion herein is deemed unnecessary to a full and complete understanding of the present invention.

GaN-based light emitting devices are capable of emitting light with high luminance. A suitable GaN-based LED device includes a substrate layer formed from a single crystal of, for example, sapphire, silicon carbide, or zinc oxide. An epitaxial buffer layer, of, for example, n+GaN is located on the substrate, followed by a sequence of epitaxial layers comprising cladding layers and active layers. Electrical contact is made between two of the layers and corresponding voltage electrodes (through a metal contact layer) to connect the LED to the circuit and source of power.

The wavelength of the light emitted by an LED is dependent on the configuration of the semiconductor layers employed in forming the LED. As is known in the art, the composition of the semiconductor layers and the dopants employed can be selected so as to produce an LED with an emission spectrum which closely matches the excitation spectrum of the phosphor material.

While the invention is described with particular reference to UV/blue light emitting components, it should be appreciated that light emitting components which emit light of a different region in the electromagnetic spectrum may also be used. For example, a red-emitting LED or LD, such as an aluminum indium gallium phosphate (AlInGaP) LED would also be applicable. Moreover, light emitting components such as those found in discharge lamps and fluorescent lamps are also contemplated for use with the present inventive phosphor compositions.

The invention has been described with reference to the preferred embodiment. Obviously, modifications and alterations will occur to others upon reading and understanding the preceding, detailed description. It is intended that the invention be construed as including all such modifications and alterations insofar as they come within the scope of the appended claims or the equivalents thereof.

What is claimed is:

1. A light emitting device comprising a light source and a phosphor composition, wherein said phosphor composition comprises at least lanthanide, Ln; at least β-diketonate ligand, A; and at least one additional ligand, B; combined in accordance with the formula $LnA_XB_Y$, where X and Y are integers.

2. The light emitting device of claim 1 wherein the lanthanide is selected from the group consisting of lanthanum, cerium, praseodymium, neodynium, samarium, europium, gadolinium, terbium, dysoprosium, holmium, erbium, thulium, ytterbium, lutetium, and mixtures thereof.

3. The light emitting device of claim 1 wherein said β-diketonate ligands are selected from the group consisting of the general formula $RCOCH_2COR'$.

4. The light emitting device of claim 3 wherein the β-diketonate ligands are different.

5. The light emitting device of claim 3 wherein the R and R' comprise alkyl, or substituted alkyl substituents, with up to about 10 carbons in the alkyl chain.

6. The light emitting device of claim 5 wherein the R and R' are $CF_3$.

7. The light emitting device of claim 1 wherein the B ligands are selected from the group consisting of the general formula $R''(Z'CH_2CH_2)_nZ''R'''$, wherein R'' and R''' are independently alkyl or substituted alkyl groups, and mixtures thereof, and wherein the ligands are able to form stable complexes with some combination of Ln and A.

8. The light emitting device of claim 7 wherein the Z' and Z'' are selected from the group consisting of oxygen, sulfur, secondary phosphines, tertiary phosphines, secondary amines, tertiary amines, and mixtures thereof.

9. The light emitting device of claim 7 wherein the Z' and Z'' are different.

10. The light emitting device of claim 8 wherein the secondary phosphines, tertiary phosphines, secondary amines, and tertiary amines are further functionalized with functional groups selected from the group consisting of hydrogen, hydroxyl, alkyl, alkoxy, amine, ethers, esters, and mixtures thereof.

11. The light emitting device of claim 7 wherein said n is an integer ranging from about 1 to about 10.

12. The light emitting device of claim 1 wherein the B ligands are selected from the group consisting of inorganic ligands capable of forming stable complexes with some combination of Ln and A, and mixtures thereof.

13. The light emitting device of claim 12 wherein the B ligands are selected from the group consisting of tetrahydrofuran, dioxane, pyridine, 2,2'-bypyridine, phenanthroline, their derivatives, and mixtures thereof.

14. The light emitting device of claim 1 wherein said X and Y are integers ranging from about 1 to about 10.

15. The light emitting device of claim 1 wherein the phosphor composition absorbs radiation in the UV range and emits light in the visible range of the electromagnetic spectrum.

16. The light emitting device of claim 1 wherein the phosphor composition is a molecular compound.

17. The light emitting device of claim 1 wherein an emission spectrum is manipulated by varying the identity of the lanthanide.

18. The light emitting device of claim 1 further comprising additional phosphors to achieve desired colors from the mix of phosphors.

19. The light emitting device of claim 1 wherein the location and shape of the absorption spectrum is manipulated by varying the identity of said acetylacetonate ligand, said B ligand, or both.

20. The light emitting device of claim 1 wherein said light source is a discharge lamp such as a metal halide lamp, a fluorescent lamp, a LED, or a LD.

21. A light emitting device comprising a LED and a phosphor, the phosphor comprised of the formula $LnA_XB_Y$, wherein:

Ln is a lanthanide;

A is at least one β-diketonate ligand;

B is at least one additional ligand;

X is an integer ranging from about 1 to about 12; and

Y is an integer ranging from about 1 to about 12.

22. The light emitting device of claim 21 wherein the phosphor is a molecular compound in which individual components can be varied to change the absorption and emission characteristics of the phosphor.

* * * * *